(12) United States Patent
Sybesma et al.

(10) Patent No.: US 10,712,377 B2
(45) Date of Patent: Jul. 14, 2020

(54) ANTENNA DIAGNOSTICS FOR WIRELESS COMMUNICATION UNIT FOR COMMUNICATING ENGINE DATA

(71) Applicant: GE Aviation Systems LLC, Grand Rapids, MI (US)

(72) Inventors: Hilbrand Harlan-Jacob Sybesma, Plainwell, MI (US); Keith Richard Feenstra, Hudsonville, MI (US); Kevin Michael James Furlong-Petsch, Kentwood, MI (US); David Joseph Steffler, Caledonia, MI (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 15/635,671

(22) Filed: Jun. 28, 2017

(65) Prior Publication Data
US 2018/0003755 A1  Jan. 4, 2018

Related U.S. Application Data

(60) Provisional application No. 62/356,680, filed on Jun. 30, 2016.

(51) Int. Cl.
| | |
|---|---|
| *G01R 29/10* | (2006.01) |
| *B64F 5/60* | (2017.01) |
| *G01R 31/50* | (2020.01) |
| *B64D 29/00* | (2006.01) |

(52) U.S. Cl.
CPC .............. *G01R 29/10* (2013.01); *B64F 5/60* (2017.01); *G01R 31/50* (2020.01); *B64D 29/00* (2013.01)

(58) Field of Classification Search
None
See application file for complete search history.

(56) References Cited

U.S. PATENT DOCUMENTS

| | | |
|---|---|---|
| 5,444,861 A | 8/1995 | Adamec et al. |
| 5,848,367 A | 12/1998 | Lotocky et al. |
| 6,092,008 A | 7/2000 | Bateman |
| 6,351,603 B2 | 2/2002 | Waithe et al. |
| 6,353,734 B1 | 3/2002 | Wright et al. |
| 6,385,513 B1 | 5/2002 | Murray et al. |
| 6,628,995 B1 | 9/2003 | Korson et al. |

(Continued)

FOREIGN PATENT DOCUMENTS

| | | |
|---|---|---|
| CN | 204495911 U | 7/2015 |
| EP | 2579473 B1 | 8/2016 |
| JP | 2957370 B2 | 10/1999 |

*Primary Examiner* — Jermele M Hollington
*Assistant Examiner* — Suresh K Rajaputra
(74) *Attorney, Agent, or Firm* — Dority & Manning, P.A.

(57) ABSTRACT

Systems and methods for recording and communicating engine data are provided. One example embodiment is directed to a method for performing diagnostics on an antenna in communication with a wireless communication unit located in a nacelle of an aerial vehicle engine. The method includes receiving, by one or more computing devices, a voltage from a diagnostic circuit for the antenna. The method includes determining, by the one or more computing devices, a change in a magnitude of the received voltage. The method includes determining, by the one or more computing devices, a condition of the antenna based on the change in the magnitude of the voltage.

20 Claims, 6 Drawing Sheets

(56) References Cited

U.S. PATENT DOCUMENTS

| | | |
|---|---|---|
| 6,671,589 B2 | 12/2003 | Holst et al. |
| 6,831,912 B1 | 12/2004 | Sherman |
| 6,868,325 B2 | 3/2005 | Menon et al. |
| 6,894,611 B2 | 5/2005 | Butz et al. |
| 7,218,277 B1 | 5/2007 | Smith |
| 7,595,730 B2 | 9/2009 | Ziarno |
| 7,636,568 B2 | 12/2009 | Gould et al. |
| 7,720,442 B2 | 5/2010 | McGuffin |
| 7,755,512 B2 | 7/2010 | Ziarno |
| 7,844,385 B2 | 11/2010 | Loda et al. |
| 7,908,042 B2 | 3/2011 | Brinkley et al. |
| 8,051,031 B2 | 11/2011 | Sims, III et al. |
| 8,055,393 B2 | 11/2011 | Sims, III et al. |
| 8,121,140 B2 | 2/2012 | McGuffin et al. |
| 8,140,298 B2 | 3/2012 | Bordry |
| 8,220,038 B1 | 7/2012 | Lucchesi et al. |
| 8,259,002 B2 | 9/2012 | Vacanti et al. |
| 8,284,674 B2 | 10/2012 | True et al. |
| 8,285,865 B2 | 10/2012 | Gruyer et al. |
| 8,351,927 B2 | 1/2013 | Wright et al. |
| 8,401,021 B2 | 3/2013 | Buga et al. |
| 8,457,034 B2 | 6/2013 | Kuehl et al. |
| 8,462,793 B2 | 6/2013 | Turcot |
| 8,615,384 B2 | 12/2013 | Angus et al. |
| 8,639,401 B2 | 1/2014 | Bailey et al. |
| 8,683,266 B2 | 3/2014 | Migliasso et al. |
| 8,699,403 B2 | 4/2014 | Lynch et al. |
| 8,723,692 B2 | 5/2014 | Farley et al. |
| 8,732,812 B2 | 5/2014 | Chopart |
| 8,781,982 B1 | 7/2014 | Das et al. |
| 8,798,817 B2 | 8/2014 | O'Dell et al. |
| 8,823,357 B2 | 9/2014 | Shafer et al. |
| 8,856,277 B2 | 10/2014 | Saugnac |
| 8,881,294 B2 | 11/2014 | Johnson et al. |
| 8,903,601 B2 | 12/2014 | Muirhead |
| 8,984,346 B2 | 3/2015 | Frayssignes et al. |
| 8,988,249 B2 | 3/2015 | Chevrette et al. |
| 8,997,197 B2 | 3/2015 | Nord et al. |
| 9,026,273 B2 | 5/2015 | Ziarno |
| 9,026,279 B2 | 5/2015 | Ziarno |
| 9,038,047 B2 | 5/2015 | Young et al. |
| 9,092,629 B2 | 7/2015 | Guzman et al. |
| 9,100,361 B1 | 8/2015 | Lucchesi et al. |
| 9,124,580 B1 | 9/2015 | Sampigethaya |
| 9,208,308 B2 | 12/2015 | McLain et al. |
| 9,225,765 B2 | 12/2015 | Kimberly et al. |
| 9,313,276 B2 | 4/2016 | Pereira |
| 9,367,970 B2 | 6/2016 | Ziarno |
| 9,369,548 B2 | 6/2016 | Voigt et al. |
| 9,390,381 B2 | 7/2016 | Davari et al. |
| 9,418,493 B1 | 8/2016 | Dong |
| 9,420,595 B2 | 8/2016 | Beacham, Jr. et al. |
| 9,426,650 B2 | 8/2016 | Bangole et al. |
| 9,481,473 B2 | 11/2016 | Skertic |
| 9,490,876 B2 | 11/2016 | Choi |
| 9,576,404 B2 | 2/2017 | Ziarno et al. |
| 9,639,997 B2 | 5/2017 | Chai et al. |
| 2003/0158963 A1 | 8/2003 | Sturdy et al. |
| 2003/0225492 A1 | 12/2003 | Cope et al. |
| 2004/0116084 A1* | 6/2004 | Ward .......... H01Q 223/00 455/130 |
| 2008/0272915 A1 | 11/2008 | Day |
| 2008/0309566 A1* | 12/2008 | Russ .......... G07C 9/00309 343/703 |
| 2009/0058682 A1 | 3/2009 | True |
| 2011/0125348 A1 | 5/2011 | Sandell et al. |
| 2012/0095662 A1 | 4/2012 | Roy et al. |
| 2014/0013002 A1 | 1/2014 | Holstein et al. |
| 2014/0068265 A1 | 3/2014 | Irwin |
| 2015/0161618 A1 | 6/2015 | Angus et al. |
| 2015/0222604 A1 | 8/2015 | Ylonen |
| 2015/0244683 A1 | 8/2015 | Schreiber |
| 2015/0276837 A1 | 10/2015 | Kim et al. |
| 2015/0293765 A1 | 10/2015 | Angus et al. |
| 2015/0330869 A1* | 11/2015 | Ziarno .......... G01M 15/14 701/34.4 |
| 2016/0075443 A1 | 3/2016 | Schmutz et al. |
| 2016/0092192 A1 | 3/2016 | Frayssignes et al. |
| 2016/0098259 A1 | 4/2016 | Mitchell |
| 2016/0110179 A1 | 4/2016 | Weckesser et al. |
| 2016/0124738 A1 | 5/2016 | Haukom et al. |
| 2016/0154391 A1 | 6/2016 | Pavaskar et al. |
| 2016/0200455 A1 | 7/2016 | Gadgil et al. |
| 2016/0203659 A1 | 7/2016 | Chai et al. |
| 2016/0219022 A1 | 7/2016 | Peterson |
| 2016/0257429 A1 | 9/2016 | Szeto |
| 2016/0314632 A1 | 10/2016 | Lu et al. |

\* cited by examiner

US 10,712,377 B2

ANTENNA DIAGNOSTICS FOR WIRELESS COMMUNICATION UNIT FOR COMMUNICATING ENGINE DATA

PRIORITY CLAIM

The present application claims the benefit of priority of U.S. Provisional Patent Application No. 62/356,680, entitled "ANTENNA DIAGNOSTICS FOR WIRELESS COMMUNICATION UNIT FOR COMMUNICATING ENGINE DATA," filed Jun. 30, 2016, which is incorporated herein by reference for all purposes.

FIELD

The present subject matter relates generally to aviation systems.

BACKGROUND

An aerial vehicle can include one or more engines for propulsion of the aerial vehicle. The one or more engines can include and/or can be in communication with one or more electronic engine controllers (EECs). The one or more EECs can record data related to the one or more engines. If the data resides on the EECs, then it can be difficult for a ground system to use the data. Automated engine data transfer replaces manual data retrieval and increases the availability of data at the ground system.

BRIEF DESCRIPTION

Aspects and advantages of embodiments of the present disclosure will be set forth in part in the following description, or may be learned from the description, or may be learned through practice of the embodiments.

One example aspect of the present disclosure is directed to a wireless communication unit in communication with an antenna located in a nacelle of an aerial vehicle. The wireless communication unit includes one or more memory devices. The wireless communication unit includes one or more processors. The one or more processors are configured to determine a change in a magnitude of a voltage received from a diagnostic circuit for an antenna. The one or more processors are configured to determine a condition of the antenna based on the determined voltage change.

Other example aspects of the present disclosure are directed to systems, methods, aerial vehicles, engines, controllers, devices, non-transitory computer-readable media for recording and communicating engine data. Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
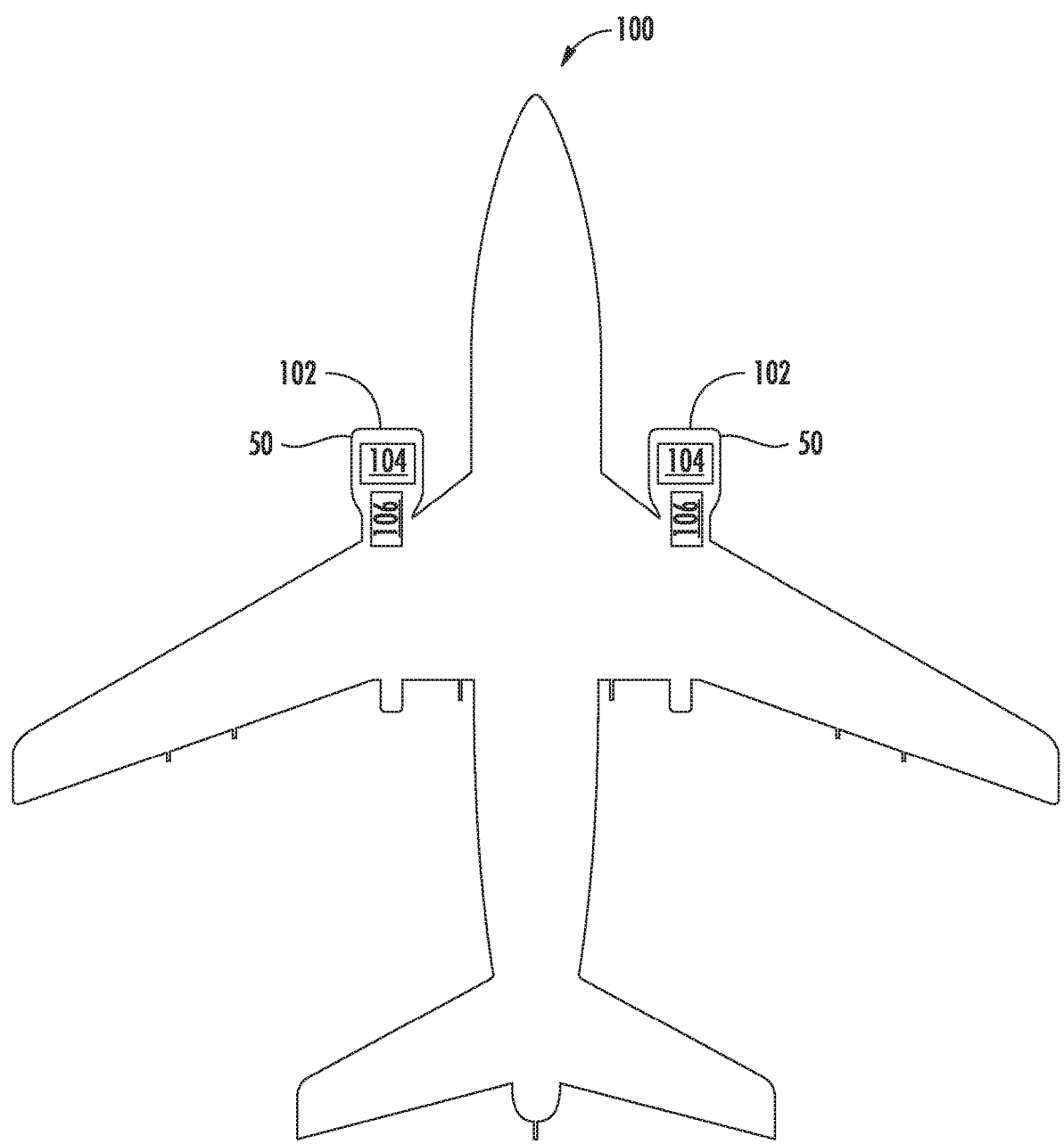
FIG. 1 depicts an aerial vehicle according to example embodiments of the present disclosure.

Reference now will be made in detail to embodiments, one or more examples of which are illustrated in the drawings. Each example is provided by way of explanation of the embodiments, not limitation of the embodiments. In fact, it will be apparent to those skilled in the art that various modifications and variations can be made in the present disclosure without departing from the scope or spirit of the invention. For instance, features illustrated or described as part of one embodiment can be used with another embodiment to yield a still further embodiment. Thus, it is intended that the present disclosure covers such modifications and variations as come within the scope of the appended claims and their equivalents.

As used in the specification and the appended claims, the singular forms "a," "an," and "the" include plural referents unless the context clearly dictates otherwise. The use of the term "about" in conjunction with a numerical value refers to within 25% of the stated amount.

Example aspects of the present disclosure are directed to methods and systems for recording and communicating engine data on an aerial vehicle. The aerial vehicle can include one or more engines for operations, such as propulsion of the aerial vehicle. The one or more engines can include and/or be in communication with one or more electronic engine controllers (EECs).

According to example embodiments of the present disclosure, the one or more engines and/or the one or more EECs can include and/or can be in communication with one or more wireless communication units (WCUs). During flight or other operation of the aerial vehicle, the one or more EECs can record data related to the one or more engines and can communicate (e.g., transmit, send, push, etc.) the data to the one or more WCUs, where the WCUs can store the data in a memory. Each EEC can communicate the data to its own associated WCU. In addition and/or in the alternative, each EEC can communicate data to a single WCU located on the aerial vehicle. Upon the occurrence of a particular trigger condition (e.g., flight phase transition), the one or more WCUs can communicate the data to a ground system over a wireless network, such as a cellular network.

In some embodiments, the WCU can be adaptable for communication with the EEC via an interface. The interface can be a Telecommunications Industry Association (TIA) TIA-485 interface or other interface, such as an Ethernet interface, an Aeronautical Radio INC (ARINC) 664 interface, an RS-232 interface, etc. The WCU can be adaptable for communication with the ground system via an antenna. The WCU can transmit information received from the EEC to the ground system. The ground system can use the information received from the WCU to determine a status (e.g., state, health, etc.) of an engine associated with the WCU. In addition, the WCU can be adaptable for communication with a portable maintenance access terminal (PMAT) for maintenance.

According to example embodiments of the present disclosure, diagnostics can be performed on the antenna with a diagnostic circuit coupled to the antenna. The diagnostic circuit can transmit (e.g., communicate, send, etc.) results to the WCU. The antenna can include a known direct current (DC) load resistance. The diagnostic circuit can include a defined resistor network. The WCU can receive a voltage from the diagnostic circuit. A magnitude of the received voltage can change depending on a condition (e.g., state) of the antenna. The change in the magnitude of the received voltage can indicate a condition of the antenna.

One example aspect of the present disclosure is directed to a wireless communication unit in communication with an antenna located in a nacelle of an aerial vehicle. The wireless communication unit includes one or more memory devices. The wireless communication unit includes one or more processors. The one or more processors are configured to receive a known direct current load resistance. The one or more processors are configured to determine a voltage change in a diagnostic circuit. The one or more processors are configured to determine a condition of the antenna based on the determined voltage change.

In an embodiment, the determined condition includes the antenna shorted to ground. In an embodiment, the determined condition includes a cable shorted to ground. In an embodiment, the determined condition includes the antenna connected. In an embodiment, the determined condition includes the antenna open. In an embodiment, the determined condition includes the antenna shorted to a voltage.

Another example aspect of the present disclosure is directed to a method for performing diagnostics on an antenna in communication with a wireless communication unit located in a nacelle of an aerial vehicle. The method includes receiving, by one or more computing devices, a voltage from a diagnostic circuit for the antenna. The method includes determining, by the one or more computing devices, a change in a magnitude of the received voltage. The method includes determining, by the one or more computing devices, a condition of the antenna based on the change in the magnitude of the received voltage.

In an embodiment, the condition of the antenna the antenna shorted to ground. In an embodiment, the condition of the antenna includes a cable shorted to ground. In an embodiment, the condition of the antenna includes the antenna connected. In an embodiment, the condition of the antenna includes the antenna open. In an embodiment, the condition of the antenna includes the antenna shorted to a voltage.

Another example aspect of the present disclosure is directed to a system. The system includes an aerial vehicle comprising at least one engine. The at least one engine is housed within a nacelle. The at least one engine includes an antenna. The at least one engine includes a wireless communication unit located in the nacelle and in communication with the antenna. The wireless communication unit includes one or more memory devices. The wireless communication unit includes one or more processors. The one or more processors are configured to receive a voltage from a diagnostic circuit for an antenna. The one or more processors are configured to determine a change in the magnitude of the received voltage. The one or more processors are configured to determine a condition of the antenna based on the change in the magnitude of the received voltage.

In an embodiment, the condition of the antenna includes the antenna shorted to ground. In an embodiment, the condition of the antenna includes a cable shorted to ground. In an embodiment, the condition of the antenna includes the antenna connected. In an embodiment, condition of the antenna includes the antenna open. In an embodiment, the condition of the antenna includes the antenna shorted to a voltage.

Another example aspect of the present disclosure is directed to an aerial vehicle. The aerial vehicle includes at least one engine. The at least one engine includes a nacelle. The at least one engine includes an antenna. The at least one engine includes a wireless communication unit located in the nacelle and in communication with the antenna. The wireless communication unit includes one or more memory devices. The wireless communication unit includes one or more processors. The one or more processors are configured to receive a voltage from a diagnostic circuit for the antenna. The one or more processors are configured to determine a change in the magnitude of the received voltage. The one or more processors are configured to determine a condition of the antenna based on the change in magnitude of the received voltage. In example embodiments, the change in the magnitude of the received voltage can indicate a change in the condition of the antenna from a first condition to a second condition that is different than the first condition.

In an embodiment, the condition of the antenna can include the antenna shorted to ground. In an embodiment, the condition of the antenna includes a cable shorted to ground. In an embodiment, the condition of the antenna includes the antenna connected. In an embodiment, the condition of the antenna includes the antenna open. In an embodiment, the condition of the antenna includes the antenna shorted to a voltage.

FIG. 1 depicts a block diagram of an aerial vehicle 100 according to example embodiments of the present disclosure. The aerial vehicle 100 can include one or more engines 102. The one or more engines 102 can cause operations, such as propulsion, of the aerial vehicle 100. An engine 102 can include a nacelle 50 for housing components. An engine 102 can be a gas turbine engine. A gas turbine engine can include a fan and a core arranged in flow communication with one another. Additionally, the core of the gas turbine engine generally includes, in serial flow order, a compressor section, a combustion section, a turbine section, and an exhaust section. In operation, air is provided from the fan to an inlet of the compressor section where one or more axial compressors progressively compress the air until it reaches the combustion section. Fuel is mixed with the compressed air and burned within the combustion section to provide combustion gases. The combustion gases are routed from the combustion section to the turbine section. The flow of combustion gases through the turbine section drives the turbine section and is then routed through the exhaust section, e.g., to atmosphere.

The one or more engines 102 can include and/or be in communication with one or more electronic engine controllers (EECs) 104. The one or more engines 102 and/or the one or more EECs 104 can include and/or be in communication with one or more wireless communication units (WCUs) 106. The one or more EECs 104 can record data related to the one or more engines 102 and communicate (e.g., transmit, send, push, etc.) the data to the one or more WCUs 106. The one or more WCUs 106 can communicate the data to a ground system via, for instance, an antenna positioned and configured within the nacelle 50. The one or more WCUs 106 can be located within a nacelle 50 housing an engine 102 or another location on the aerial vehicle 100.

Figure 2:
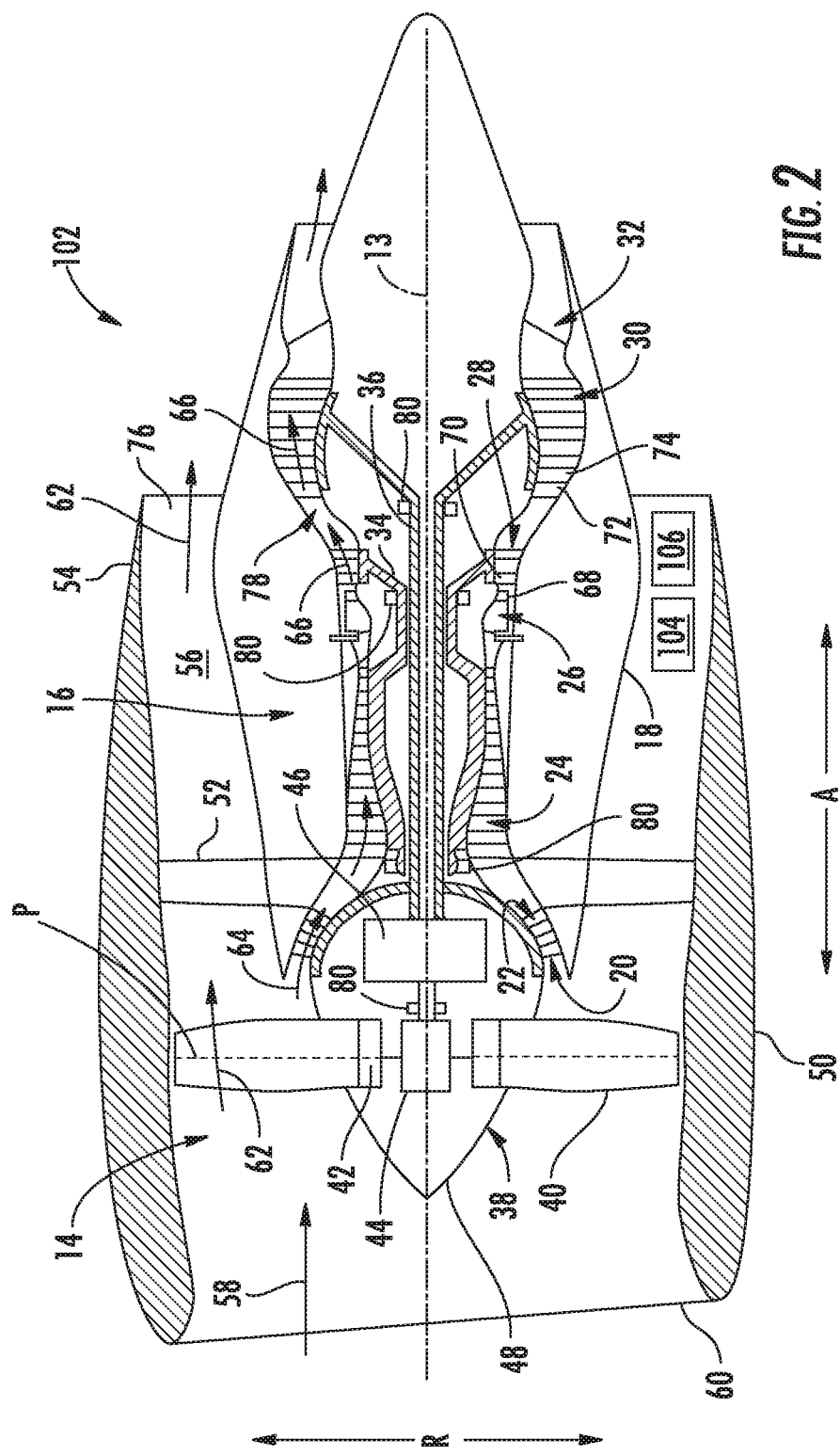
FIG. 2 depicts an engine according to example embodiments of the present disclosure.

FIG. 2 depicts an engine 102 according to example embodiments of the present disclosure. The engine 102 can be one of the one or more engines 102 on the aerial vehicle 100 in FIG. 1. More particularly, for the embodiment of FIG. 2, the engine 102 is configured as a gas turbine engine, or rather as a high-bypass turbofan jet engine 102, referred to herein as "turbofan engine 102." Those of ordinary skill in the art, using the disclosures provided herein, will understand that WCUs can be used in conjunction with other types of propulsion engines without deviating from the scope of the present disclosure, including engines associated with helicopters and other aerial vehicles.

As shown in FIG. 2, the turbofan engine 102 defines an axial direction A (extending parallel to a longitudinal centerline 13 provided for reference), a radial direction R, and a circumferential direction (not shown) extending about the axial direction A. In general, the turbofan includes a fan section 14 and a core turbine engine 16 disposed downstream from the fan section 14.

The exemplary core turbine engine 16 depicted generally includes a substantially tubular outer casing 18 that defines an annular inlet 20. The outer casing 18 encases and the core turbine engine 16 includes, in serial flow relationship, a compressor section including a booster or low pressure (LP) compressor 22 and a high pressure (HP) compressor 24; a combustion section 26; a turbine section including a high pressure (HP) turbine 28 and a low pressure (LP) turbine 30; and a jet exhaust nozzle section 32. A high pressure (HP) shaft or spool 34 drivingly connects the HP turbine 28 to the HP compressor 24. A low pressure (LP) shaft or spool 36 drivingly connects the LP turbine 30 to the LP compressor 22. Accordingly, the LP shaft 36 and HP shaft 34 are each rotary components, rotating about the axial direction A during operation of the turbofan engine 102.

In order to support such rotary components, the turbofan engine includes a plurality of air bearings 80 attached to various structural components within the turbofan engine 102. Specifically, for the embodiment depicted the bearings 80 facilitate rotation of, e.g., the LP shaft 36 and HP shaft 34 and dampen vibrational energy imparted to bearings 80 during operation of the turbofan engine 102. Although the bearings 80 are described and illustrated as being located generally at forward and aft ends of the respective LP shaft 36 and HP shaft 34, the bearings 80 may additionally, or alternatively, be located at any desired location along the LP shaft 36 and HP shaft 34 including, but not limited to, central or mid-span regions of the shafts 34, 36, or other locations along shafts 34, 36 where the use of conventional bearings 80 would present significant design challenges. Further, bearings 80 may be used in combination with conventional oil-lubricated bearings. For example, in one embodiment, conventional oil-lubricated bearings may be located at the ends of shafts 34, 36, and one or more bearings 80 may be located along central or mid-span regions of shafts 34, 36.

Referring still to the embodiment of FIG. 2, the fan section 14 includes a fan 38 having a plurality of fan blades 40 coupled to a disk 42 in a spaced apart manner. As depicted, the fan blades 40 extend outwardly from disk 42 generally along the radial direction R. Each fan blade 40 is rotatable relative to the disk 42 about a pitch axis P by virtue of the fan blades 40 being operatively coupled to a suitable pitch change mechanism 44 configured to collectively vary the pitch of the fan blades 40 in unison. The fan blades 40, disk 42, and pitch change mechanism 44 are together rotatable about the longitudinal axis 13 by the LP shaft 36 across a power gear box 46. The power gear box 46 includes a plurality of gears for adjusting the rotational speed of the fan 38 relative to the LP shaft 36 to a more efficient rotational fan speed. More particularly, the fan section includes a fan shaft rotatable by the LP shaft 36 across the power gearbox 46. Accordingly, the fan shaft may also be considered a rotary component, and is similarly supported by one or more bearings.

Referring still to the exemplary embodiment of FIG. 2, the disk 42 is covered by a rotatable front hub 48 aerodynamically contoured to promote an airflow through the plurality of fan blades 40. Additionally, the exemplary fan section 14 includes an annular fan casing or outer nacelle 50 that circumferentially surrounds the fan 38 and/or at least a portion of the core turbine engine 16. The exemplary nacelle 50 is supported relative to the core turbine engine 16 by a plurality of circumferentially-spaced outlet guide vanes 52. Moreover, a downstream section 54 of the nacelle 50 extends over an outer portion of the core turbine engine 16 so as to define a bypass airflow passage 56 therebetween.

During operation of the turbofan engine 102, a volume of air 58 enters the turbofan through an associated inlet 60 of the nacelle 50 and/or fan section 14. As the volume of air 58 passes across the fan blades 40, a first portion of the air 58 as indicated by arrows 62 is directed or routed into the bypass airflow passage 56 and a second portion of the air 58 as indicated by arrow 64 is directed or routed into the core air flowpath, or more specifically into the LP compressor 22. The ratio between the first portion of air 62 and the second portion of air 64 is commonly known as a bypass ratio. The pressure of the second portion of air 64 is then increased as it is routed through the high pressure (HP) compressor 24 and into the combustion section 26, where it is mixed with fuel and burned to provide combustion gases 66.

The combustion gases 66 are routed through the HP turbine 28 where a portion of thermal and/or kinetic energy from the combustion gases 66 is extracted via sequential stages of HP turbine stator vanes 68 that are coupled to the outer casing 18 and HP turbine rotor blades 70 that are coupled to the HP shaft or spool 34, thus causing the HP shaft or spool 34 to rotate, thereby supporting operation of the HP compressor 24. The combustion gases 66 are then routed through the LP turbine 30 where a second portion of thermal and kinetic energy is extracted from the combustion gases 66 via sequential stages of LP turbine stator vanes 72 that are coupled to the outer casing 18 and LP turbine rotor blades 74 that are coupled to the LP shaft or spool 36, thus causing the LP shaft or spool 36 to rotate, thereby supporting operation of the LP compressor 22 and/or rotation of the fan 38.

The combustion gases 66 are subsequently routed through the jet exhaust nozzle section 32 of the core turbine engine 16 to provide propulsive thrust. Simultaneously, the pressure of the first portion of air 62 is substantially increased as the first portion of air 62 is routed through the bypass airflow passage 56 before it is exhausted from a fan nozzle exhaust section 76 of the turbofan, also providing propulsive thrust. The HP turbine 28, the LP turbine 30, and the jet exhaust nozzle section 32 at least partially define a hot gas path 78 for routing the combustion gases 66 through the core turbine engine 16.

It should be appreciated, however, that the exemplary turbofan engine 102 depicted in FIG. 2 is provided by way of example only, and that in other exemplary embodiments, the turbofan engine 102 may have any other suitable configuration. It should also be appreciated, that in still other exemplary embodiments, aspects of the present disclosure may be incorporated into any other suitable gas turbine engine or other propulsion engine. For example, in other exemplary embodiments, aspects of the present disclosure may be incorporated into, e.g., a turboprop engine, a turboshaft engine, or a turbojet engine. Further, in still other embodiments, aspects of the present disclosure may be incorporated into any other suitable turbomachine, including, without limitation, a steam turbine, a turboshaft, a centrifugal compressor, and/or a turbocharger.

According to example aspects of the present disclosure, the engine 102 can include an electronic engine controller (EEC) 104. The EEC 104 can record operational and performance data for the engine 102. The EEC 104 can be in communication with a wireless communication unit (WCU) 106. The WCU 106 can be mounted on the engine 102. The EEC 104 and the WCU 106 can communicate using wireless and/or wired communications. In some embodiments, the communication with the EEC 104 and the WCU 106 can be one-way communication (e.g., the EEC 104 to the WCU 106). In some embodiments, the communication with the EEC 104 and the WCU 106 can be two-way communication. The WCU 106 can be located on the engine or elsewhere on the aerial vehicle 100. The nacelle 50 can include an antenna (not shown). In another aspect, the antenna can be integrated with the WCU 106. In another aspect, the antenna can be located elsewhere on the aerial vehicle and used by the WCU and optionally other devices.

Figure 3:
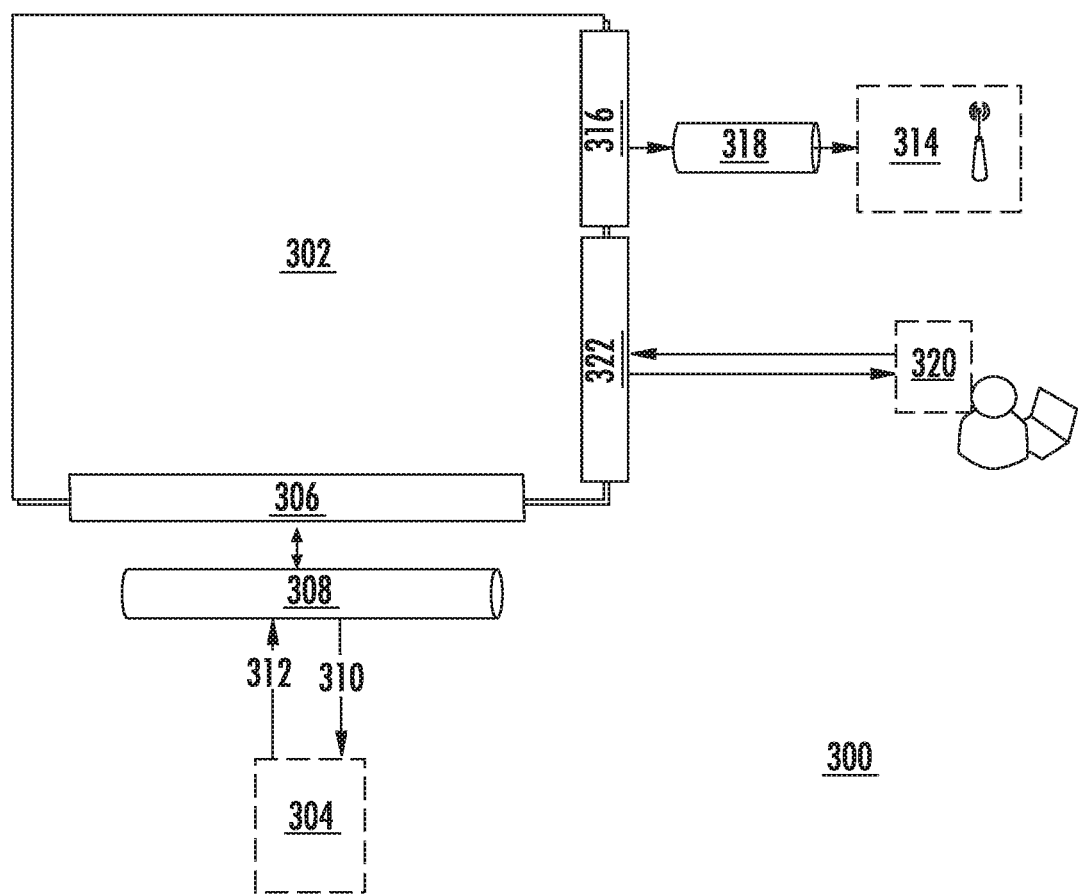
FIG. 3 depicts a wireless communication system according to example embodiments of the present disclosure.

FIG. 3 depicts a wireless communication system (WCS) 300 according to example embodiments of the present disclosure. The system 300 can include a wireless communication unit (WCU) 302. The WCU 302 can be the WCU 106 of FIGS. 1 and 2. The WCU 302 can be in communication with an electronic engine controller (EEC) 304 over a suitable interface 306. The EEC 304 can be the same as the EEC 104 of FIGS. 1 and 2. In some embodiments, the interface 306 can be, for instance, a Telecommunications Industry Association (TIA) TIA-485 interface 306.

In particular implementations, the WCU 302 and the EEC 304 can communicate via a connection 308 with, for instance, the TIA-485 interface 306. The connection 308 can, for example, accommodate other interfaces, such as an Ethernet connection, a wireless connection, or other interface. The WCU 302 can transmit addressing (e.g., memory location, bit size, etc.) information and/or acknowledgements 310 to the EEC 304 via the connection 308. The WCU 302 can receive data 312 from the EEC 304 via the connection 308 and can store the data in one or more memory devices. The data 312 can be, for instance, continuous engine operation data, such as thrust level inputs, engine response to thrust level inputs, vibration, flameout, fuel consumption, ignition state, N1 rotation, N2 rotation, N3 rotation, anti-ice capability, fuel filter state, fuel valve state, oil filter state, etc.

The WCU 302 can be configured to communicate the data 312 over a wireless network via an antenna 314 upon the occurrence of one or more trigger conditions, such as trigger conditions based on signals indicative of the aerial vehicle 100 being on the ground or near the ground. In some embodiments, the antenna 314 can be integrated into the WCU 302. In some embodiments, the WCU 302 can include a radio frequency (RF) interface 316. In an embodiment, the antenna 314 can be in communication with the RF interface 316 via an RF cable 318. In an embodiment, the antenna 314 can be placed in the nacelle 50 of an aircraft 102. The nacelle 50 of an aerial vehicle 100 can be made of conductive materials, which can obstruct cellular reception and transmission. In some embodiments, the antenna can be a directional antenna that is oriented near one or more gaps in the nacelle 50 to permit the antenna 314 to communicate directionally outside of the nacelle 50 when the aerial vehicle 100 is landing or upon the occurrence of other trigger conditions.

In some embodiments, the WCU 302 can include an interface for communicating with a portable maintenance access terminal (PMAT) 320. The PMAT 320 can be implemented, for instance, on a laptop, tablet, mobile device, or other suitable computing device. The PMAT 320 can be, for instance, a Generic Stream Encapsulation (GSE) interface 322 or other suitable interface. The PMAT 320 can be used by a maintenance person to calibrate, troubleshoot, initialize, test, etc. the WCU 302.

The WCU 302 can communicate using wireless communication. The wireless communication can be performed using any suitable wireless technique and/or protocol. For example, the wireless communication can be performed using peer-to-peer communications, network communications, cellular-based communications, satellite-based communications, etc. As another example, the wireless communications can be performed using Wi-Fi, Bluetooth, ZigBee, etc.

Figure 4:
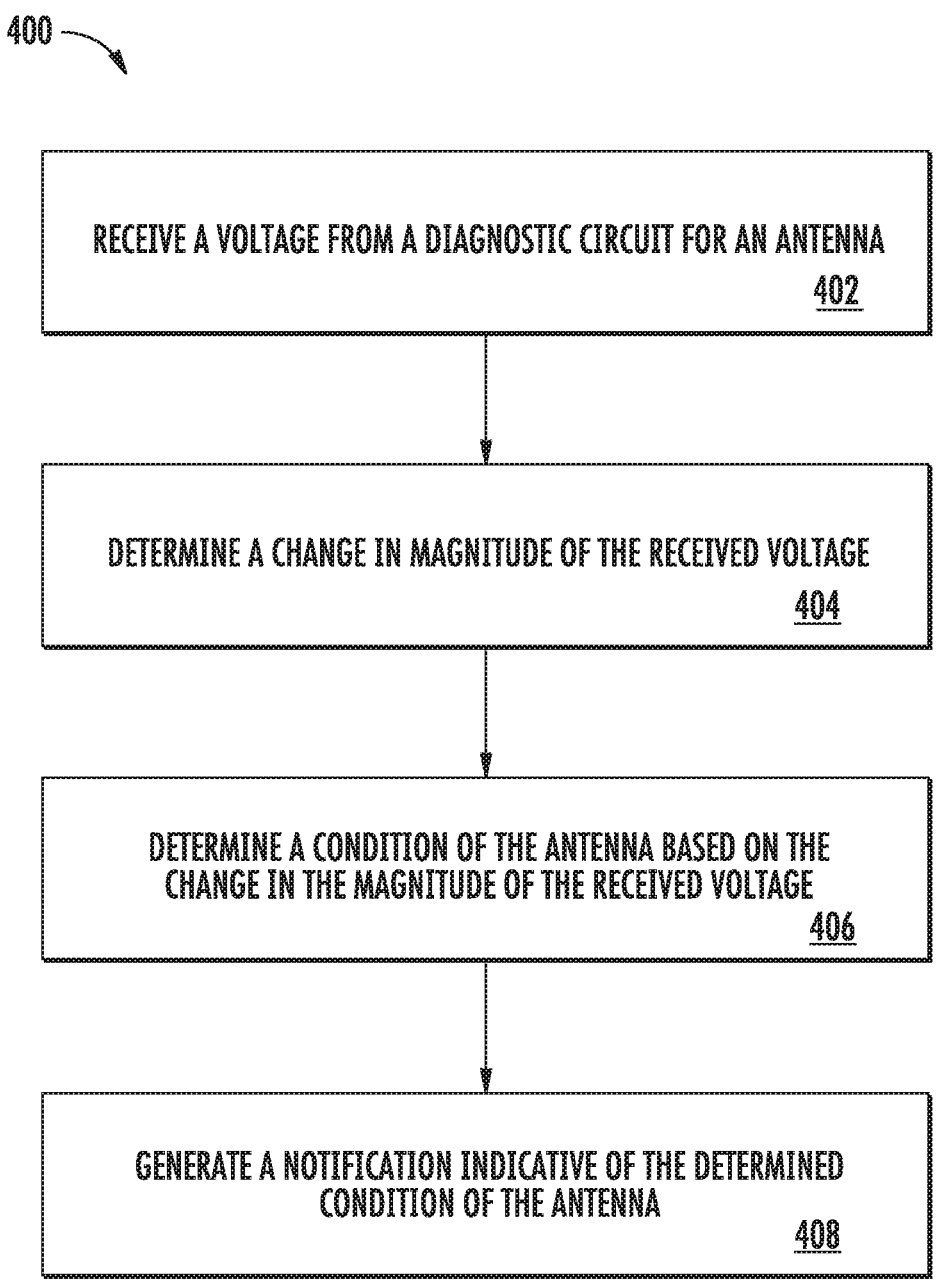
FIG. 4 depicts a flow diagram of an example method according to example embodiments of the present disclosure.

FIG. 4 depicts a flow diagram of an example method (400) for performing diagnostics on an antenna in communication with a wireless communication unit (WCU) located in a nacelle of an aerial vehicle engine. The method of FIG. 4 can be implemented using, for instance, the WCU 302 of FIG. 3. FIG. 4 depicts steps performed in a particular order for purposes of illustration and discussion. Those of ordinary skill in the art, using the disclosures provided herein, will understand that various steps of any of the methods disclosed herein can be adapted, modified, rearranged, or modified in various ways without deviating from the scope of the present disclosure.

At (402), the one or more processors of the WCU 302 can receive a voltage from a diagnostic circuit for the antenna 314. At (404), the one or more processors of the WCU can determine a change in the magnitude of the received voltage. For instance, the magnitude of the received voltage can change from 3.33 Volts to 2.15 Volts. At (406), a condition of the antenna can be determined based on the change in the magnitude of the received voltage. For instance, the determined condition can include the antenna shorted to ground. The determined condition can include a cable shorted to ground. The determined condition can include the antenna connected. The determined condition can include the antenna open. The determined condition can include the antenna shorted to a voltage. At (408), the method 400 can further include generating, by the one or more processors of the WCU, a notification indicative of the determined condition of the antenna. More specifically, the notification can be displayed on a feedback device viewable by a user of the feedback device.

Figure 5:
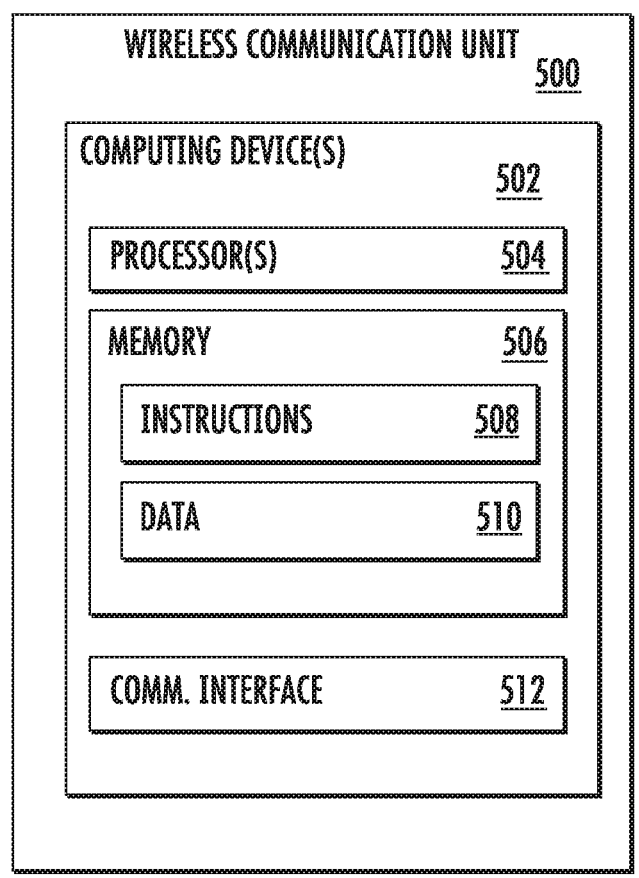
FIG. 5 depicts a computing system for implementing one or more aspects according to example embodiments of the present disclosure.

FIG. 5 depicts a block diagram of an example computing system that can be used to implement a wireless communication unit (WCU) 500, such as WCU 302, or other systems according to example embodiments of the present disclosure. As shown, the WCU 500 can include one or more computing device(s) 502. The one or more computing device(s) 502 can include one or more processor(s) 504 and one or more memory device(s) 506. The one or more processor(s) 504 can include any suitable processing device, such as a microprocessor, microcontroller, integrated circuit, logic device, or other suitable processing device. The one or more memory device(s) 506 can include one or more computer-readable media, including, but not limited to, non-transitory computer-readable media, RAM, ROM, hard drives, flash drives, or other memory devices.

The one or more memory device(s) 506 can store information accessible by the one or more processor(s) 504, including computer-readable instructions 508 that can be executed by the one or more processor(s) 504. The instructions 508 can be any set of instructions that when executed by the one or more processor(s) 504, cause the one or more processor(s) 504 to perform operations. The instructions 508 can be software written in any suitable programming language or can be implemented in hardware. In some embodiments, the instructions 508 can be executed by the one or more processor(s) 504 to cause the one or more processor(s) 504 to perform operations, such as the operations for recording and communicating engine data, as described with reference to FIG. 4, and/or any other operations or functions of the one or more computing device(s) 502.

The memory device(s) 506 can further store data 510 that can be accessed by the processors 504. For example, the data 510 can include data associated with engine performance, engine operation, engine failure, errors in engine performance, errors in engine operation, errors in engine behavior, expected engine behavior, actual engine behavior, etc., as described herein. The data 510 can include one or more table(s), function(s), algorithm(s), model(s), equation(s), etc. according to example embodiments of the present disclosure.

The one or more computing device(s) 502 can also include a communication interface 512 used to communicate, for example, with the other components of system. For example, the communication interface 512 can accommodate communications with the EEC 304, the antenna 314, the PMAT 320, a ground control system, other WCUs 302, a central computing device, any other device, and/or any combination of the foregoing. The communication interface 512 can include any suitable components for interfacing with one or more network(s), including for example, transmitters, receivers, transceivers, ports, controllers, antennas, or other suitable components.

Figure 6:
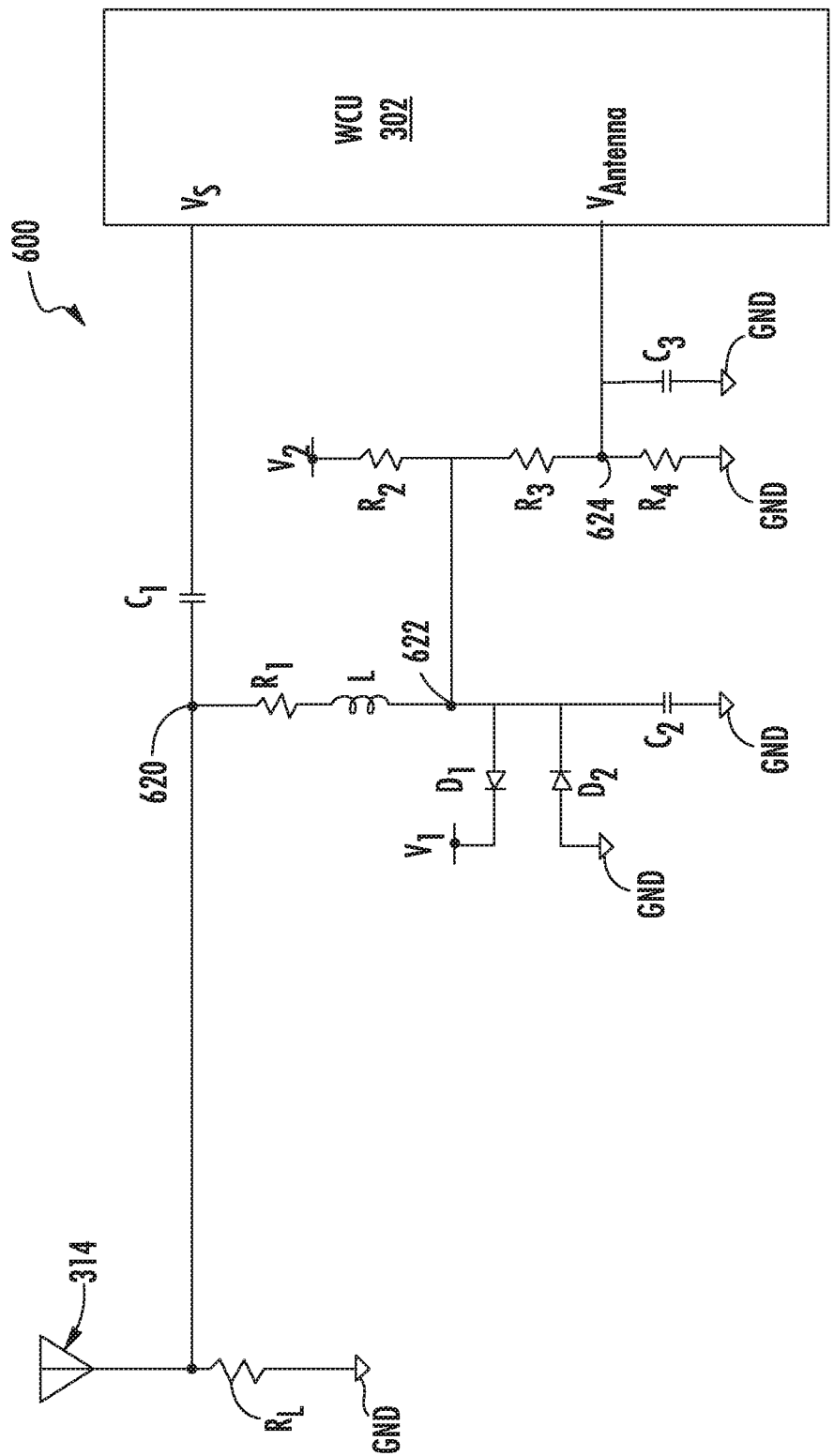
FIG. 6 depicts a circuit diagram according to example embodiments of the present disclosure.

FIG. 6 depicts a schematic of a diagnostic circuit 600 according to example embodiments of the present disclosure. The diagnostic circuit 600 can be used to determine a condition (e.g., state, etc.) of the antenna 314. In example embodiments, the WCU 302 can be electrically coupled to the diagnostic circuit 600. In this way, the WCU 302 can provide electrical power to the diagnostic circuit 600 and, as will be discussed below in more detail, can determine a condition of the antenna 314 via a voltage received from the diagnostic circuit 600.

In example embodiments, the diagnostic circuit 600 can include a plurality of passive elements (e.g., resistors, capacitors, inductors). In particular, a first capacitor $C_1$ can be electrically coupled to the WCU 302 and a first node 620 of the diagnostic circuit 600. The first capacitor $C_1$ can be a filter capacitor configured to remove a ripple from electrical power provided by the WCU 302. More specifically, a capacitance of the first capacitor $C_1$ can be equal to 100 picoFarads (pF). It should be appreciated, however, that the capacitance of the first capacitor $C_1$ can be equal to any suitable value. As will be discussed below in more detail, the diagnostic circuit 600 can include a load resistor $R_L$.

The load resistor $R_L$ can be electrically coupled to the antenna 314 and a ground node GND of the diagnostic circuit 600. More specifically, a first end of the load resistor $R_L$ can be electrically coupled to the antenna 314, and the second end of the load resistor $R_L$ can be electrically coupled to the ground node GND. In addition, a resistance value of the load resistor $R_L$ can have a known value. For example, the resistance value of the load resistor $R_L$ can be equal to 10 kΩ. In example embodiments, a potential (e.g., voltage) across the load resistor $R_L$ can vary due, at least in part, to changes in the condition (e.g., state) of the antenna 314. For example, if the antenna 314 is disconnected from the diagnostic circuit 600, the potential across the load resistor $R_L$ can decrease. Conversely, if the antenna 314 is connected to the diagnostic circuit 600, the potential across the load resistor $R_L$ can increase. In either instance, the change in potential across the load resistor $R_L$ can cause the potential at the first node 620 to change (e.g., increase or decrease).

In example embodiments, the diagnostic circuit 600 can include a first resistor $R_1$ and an inductor L. As shown, a first end of the first resistor $R_1$ can be electrically coupled to the first node 620, and a second end of the first resistor $R_1$ can be electrically coupled to a first end of the inductor L. In addition, a second end of the inductor L can be coupled to a second node 622 of the circuit 600. In this way, the second resistor $R_2$ and the inductor L can be in series with one another. In example embodiments, a value of the second resistor $R_2$ can be equal to 2.7 kΩ, and a value of the inductor L can be equal to 100 nanohenries (nH). It should be appreciated, however, that the second resistor $R_2$ can have any suitable resistance and the inductor L can have any suitable inductance.

In example embodiments, the diagnostic circuit 600 can include a pair of diodes $D_1$ and $D_2$. The first diode $D_1$ can be electrically coupled to the second node 622 and a first voltage source $V_1$. In particular, an anode end of the first diode $D_1$ can be electrically coupled to the second node 622, and the cathode end of the first diode $D_1$ can be electrically coupled to the first voltage source $V_1$. In this way, the first diode $D_1$ permits electrical current to flow from the second node 622 to the first voltage source $V_1$. In contrast, however, the first diode $D_1$ blocks electrical current flowing from the first voltage source $V_1$ to the second node 622. As shown, the second diode $D_2$ is electrically coupled to the second node 622 and the ground node GND. In particular, the anode end of the second diode $D_2$ can be electrically coupled to the ground node GND, and the cathode end of the second diode $D_2$ can be electrically coupled to the to the second node 622 of the circuit 600. In this way, the second diode $D_2$ permits current flowing from the ground node GND to the second node 622. In addition, the second diode $D_2$ blocks current flowing from the second node 622 to the ground node GND.

In example embodiments, the first diode $D_1$ and the second diode $D_2$ can be blocking diodes. In addition, the first voltage source $V_1$ can be configured to provide a voltage of 3.3 Volts. In alternative embodiments, however, the first voltage source $V_1$ can provide a different voltage. For example, the first voltage source $V_1$ can be configured to provide a voltage of 5 Volts.

As shown, the diagnostic circuit 600 can include a second capacitor $C_2$ electrically coupled to the second node 622 and a ground node GND. In example embodiments, a capacitance of the second capacitor $C_2$ can be equal to 33 picoFarads (pF). It should be appreciated, however, that the second capacitor $C_2$ can include any suitable value.

Alternatively or additionally, the diagnostic circuit 600 can include a second resistor $R_2$ and a third resistor $R_3$. As shown, the second resistor $R_2$ can be electrically coupled to a second voltage source $V_2$ and the second node 622 of the diagnostic circuit 600. In particular, a first end of the second resistor $R_2$ can be electrically coupled to the second voltage source $V_2$, and a second end of the second resistor $R_2$ can be electrically coupled to the second node 622. The third resistor R₃ can be coupled to the second node 622 and a third node 624. In particular, a first end of the third resistor R₃ can be electrically coupled to the second node 622, and a second end of the third resistor R₃ can be electrically coupled to the third node 624. In this way, the second and third resistors R₂ and R₃ can form a voltage divider configured to step down a voltage provided by the second voltage source V₂.

In example embodiments, a resistance value of the second resistor R₂ can be less than a resistance value of the third resistor R₃. More specifically, a resistance value of the second resistor R₂ can be equal to 6.8 kΩ, and the resistance value of the third resistor R₃ can be equal to 3.9 kΩ. It should be appreciated, however, that the second resistor R₂ and the third resistor R₃ can have any suitable resistance value.

The diagnostic circuit 600 can further include a fourth resistor R₄ electrically coupled to the third node 624 and the ground node GND. More specifically, a first end of the fourth resistor R₄ can be electrically coupled to the third node 624, and a second end of the fourth resistor R₄ can be electrically coupled to the ground node GND. More specifically, a resistance value of the fourth resistor R₄ can be equal to 20 kΩ. It should be appreciated, however, that the fourth resistor R₄ can have any suitable resistance value.

As shown, the diagnostic circuit 600 can include a third capacitor C₃ electrically coupled to the third node 624 and the ground node GND. More specifically, a first end of the third capacitor C₃ can be electrically coupled to the third node 624, and a second end of the third capacitor C₃ can be electrically coupled to the ground node GND. As will be discussed below in more detail, the WCU 302 can be electrically coupled to the third node 624 of the diagnostic circuit 600.

In example embodiments, the WCU 302 can monitor the magnitude of a voltage $V_{antenna}$ at the third node 624 of the diagnostic circuit 600. In this way, the WCU 305 can determine the condition of the antenna 314 based, at least in part, on changes in the magnitude of voltage $V_{antenna}$ at the third node 624. For example, if the antenna 314 is disconnected from the diagnostic circuit 600, the voltage $V_{antenna}$ at the third node 624 can be equal to 3.33 Volts. If the condition of the antenna 314 is open, the voltage $V_{antenna}$ can be equal to 2.15 volts. If, however, the antenna 314 is later connected to the diagnostic circuit 600, the voltage $V_{antenna}$ at the third node 624 can change from 3.33 Volts or 2.15 Volts to 1.517 Volts. Still further, if the antenna 314 is grounded while connected to the diagnostic circuit 600, the voltage $V_{antenna}$ at the third node 624 can be equal to 0.726 Volts. It should be appreciated that the voltage $V_{antenna}$ at the third node 624 can be equal to any suitable value for each of the above conditions (e.g., disconnected, open, connected, grounded) of the antenna 314.

Although specific features of various embodiments may be shown in some drawings and not in others, this is for convenience only. In accordance with the principles of the present disclosure, any feature of a drawing may be referenced and/or claimed in combination with any feature of any other drawing. Example aspects of the present disclosure are discussed with referenced to aerial vehicles. Those of ordinary skill in the art, using the disclosures provided herein, will understand that example aspects of the present disclosure can be used with other vehicles having engines.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system comprising:
    an aerial vehicle comprising at least one engine, the at least one engine comprising:
        a nacelle;
        an antenna;
        a diagnostic circuit comprising:
            a ground node;
            a load resistor electrically coupled to the antenna and the ground;
            a first resistor electrically coupled to the load resistor at a first node of the diagnostic circuit;
            a second resistor electrically coupled to the first resistor at a second node of the diagnostic circuit;
            a third resistor electrically coupled to the second resistor at the second node of the diagnostic circuit; and
            a fourth resistor electrically coupled to the third resistor at a third node of the diagnostic circuit,
        a wireless communication unit located in the nacelle and in communication with the diagnostic circuit, the wireless communication unit comprising:
            one or more memory devices; and
            one or more processors, the one or more processors configured to:
                receive a voltage from the diagnostic circuit for the antenna,
                wherein the voltage is received from the third node of the diagnostic circuit;
                determine a change in a magnitude of the received voltage; and
                determine a condition of the antenna based, at least in part, on the change in the magnitude of the received voltage.

2. The system of claim 1, wherein the determined condition comprises the antenna shorted to ground.

3. The system of claim 1, wherein the determined condition comprises at least one of a cable shorted to ground and the antenna shorted to ground.

4. The system of claim 1, wherein the determined condition comprises the antenna connected.

5. The system of claim 1, wherein the determined condition comprises the antenna open.

6. The system of claim 1, wherein a change in the magnitude of the received voltage indicates a change in the condition of the antenna from a first condition to a second condition.

7. A method for performing diagnostics on an antenna in communication with a wireless communication unit located in a nacelle of an aerial vehicle engine comprising:
    receiving, by one or more computing devices, a voltage from a diagnostic circuit for the antenna, wherein the diagnostic circuit comprises a ground node, a load resistor electrically coupled to the antenna and the ground, a first resistor electrically coupled to the load resistor at a first node of the diagnostic circuit, a second resistor electrically coupled to the first resistor at a second node of the diagnostic circuit, a third resistor electrically coupled to the second resistor at the second node of the diagnostic circuit, and a fourth resistor electrically coupled to the third resistor at a third node of the diagnostic circuit, wherein the voltage is received from the third node of the diagnostic circuit;

determining, by the one or more computing devices, a change in a magnitude of the voltage received from the diagnostic circuit; and determining, by the one or more computing devices, a condition of the antenna based, at least in part, on the change in the magnitude of the received voltage.

8. The method of claim 7, wherein the determined condition comprises the antenna shorted to ground.

9. The method of claim 7, wherein the determined condition comprises at least one of a cable shorted to ground and the antenna shorted to ground.

10. The method of claim 7, wherein the determined condition comprises the antenna connected.

11. The method of claim 7, wherein the determined condition comprises the antenna open.

12. The method of claim 8, further comprising generating, by the one or more computing device, a notification indicative of the determined condition of the antenna.

13. A diagnostic circuit for an antenna located in a nacelle of a gas turbine engine mounted to an aerial vehicle, the diagnostic circuit comprising:
a load resistor electrically coupled to the antenna and a ground node of the diagnostic circuit, the load resistor having a known resistance;
a first resistor electrically coupled to the load resistor at a first node of the diagnostic circuit;
a second resistor electrically coupled to the first resistor at a second node of the diagnostic circuit;
a third resistor electrically coupled to the second resistor at the second node of the diagnostic circuit; and
a fourth resistor electrically coupled to the third resistor at a third node of the diagnostic circuit, wherein when a condition of the antenna changes, a magnitude of a voltage at the third node changes due, at least in part, to a change in a voltage across the load resistor, and wherein the magnitude of the voltage used to determine the condition of the antenna is received from only the third node along the diagnostic circuit.

14. The diagnostic circuit of claim 13, wherein the load resistor is directly electrically connected to the antenna.

15. The diagnostic circuit of claim 13, wherein the condition comprises at least one of the antenna connected and the antenna shorted to ground.

16. The diagnostic circuit of claim 13, further comprising a first blocking diode and a second blocking diode, the first blocking diode electrically coupled to the second node and a first voltage source of the diagnostic network, the second blocking diode electrically coupled to the second node and a ground node of the diagnostic circuit.

17. The diagnostic circuit of claim 16, further comprising a second voltage source electrically coupled to the second resistor, the second voltage source providing a voltage that is equal to a voltage provided by the first voltage source.

18. The diagnostic circuit of claim 13, further comprising an inductor electrically coupled to the second node and the first resistor, the inductor and the first resistor being in series with one another.

19. The diagnostic circuit of claim 13, further comprising a first capacitor and a second capacitor, the first capacitor electrically coupled to the first node and a wireless communication unit, the second capacitor electrically coupled to the second node and a ground node of the diagnostic circuit.

20. The diagnostic circuit of claim 19, further comprising a third capacitor electrically coupled to the third node and the ground node of the diagnostic circuit.

* * * * *